(12) United States Patent
Raisa

(10) Patent No.: US 11,371,156 B2
(45) Date of Patent: Jun. 28, 2022

(54) CHROMIUM-BASED COATING, A METHOD FOR PRODUCING A CHROMIUM-BASED COATING AND A COATED OBJECT

(71) Applicant: Savroc Ltd, Kuopio (FI)

(72) Inventor: Jussi Raisa, Kuopio (FI)

(73) Assignee: SAVROC LTD, Kuopio (FI)

( * ) Notice: Subject to any disclaimer, the term of this patent is extended or adjusted under 35 U.S.C. 154(b) by 1011 days.

(21) Appl. No.: 15/758,912

(22) PCT Filed: Sep. 8, 2016

(86) PCT No.: PCT/FI2016/050625
§ 371 (c)(1),
(2) Date: Mar. 9, 2018

(87) PCT Pub. No.: WO2017/042438
PCT Pub. Date: Mar. 16, 2017

(65) Prior Publication Data
US 2019/0040540 A1     Feb. 7, 2019

Related U.S. Application Data

(63) Continuation-in-part of application No. PCT/FI2015/050587, filed on Sep. 9, 2015.

(30) Foreign Application Priority Data

Sep. 9, 2015    (WO) .................. PCT/FI2015/050587

(51) Int. Cl.
*C25D 3/06*    (2006.01)
*C25D 5/50*    (2006.01)
(Continued)

(52) U.S. Cl.
CPC ............. *C25D 5/50* (2013.01); *C25D 3/06* (2013.01); *C25D 3/56* (2013.01); *C25D 5/14* (2013.01);
(Continued)

(58) Field of Classification Search
None
See application file for complete search history.

(56) References Cited

U.S. PATENT DOCUMENTS 2,693,444 A * 11/1954 Snavely ................ C25D 3/56
                                                        205/281
3,111,464 A * 11/1963 Safranek, Jr. ........... C25D 3/06
                                                        205/101
(Continued)

FOREIGN PATENT DOCUMENTS

EP          0688886 A1    12/1995
EP          2899299     *  7/2015  ............... C25D 3/06
(Continued)

OTHER PUBLICATIONS

Extended European Search Report, Application No. 16843730.9, dated Apr. 3, 2019.
(Continued)

*Primary Examiner* — Stefanie S Wittenberg
(74) *Attorney, Agent, or Firm* — Brooks Kushman P.C.

(57) ABSTRACT

A chromium-based coating including chromium (Cr), carbon (C) and iron (Fe), Cr being electroplated from a trivalent Cr bath. The coating is further includes nickel (Ni) electroplated from the Cr bath having at least 20 mg l–1 Ni cations, in that C is at least partially in the form of at least one chromium carbide compound, in that the coating has been heat-treated at a temperature of 400-1,200° C., and in that the hardness of the coating is at least 1,500 HV on a Vickers microhardness scale as measured according to standard SFS-EN ISO 4516. A method for producing a coating and to a coated object is also disclosed.

16 Claims, 1 Drawing Sheet a) Electroplating a Cr-based layer on a substrate from a trivalent Cr bath containing 20-80 mg $l^{-1}$ Ni cations b) Subjecting the coated object to at least one heat treatment at 400-1,200 °C

(51) Int. Cl.
*C25D 3/56* (2006.01)
*C25D 5/14* (2006.01)
*C25D 5/36* (2006.01)
*C25D 5/00* (2006.01)
*C23C 16/00* (2006.01)

(52) U.S. Cl.
CPC ............... *C25D 5/36* (2013.01); *C25D 5/617* (2020.08); *C25D 5/627* (2020.08); *C23C 16/00* (2013.01); *Y10T 428/12847* (2015.01)

(56) References Cited

U.S. PATENT DOCUMENTS

| | | | |
|---|---|---|---|
| 3,917,517 | A | 11/1975 | Jordan et al. |
| 5,271,823 | A * | 12/1993 | Schachameyer ......... C25D 3/06 |
| | | | 205/224 |
| 2012/0052319 | A1 * | 3/2012 | Sugawara ............... C25D 5/619 |
| | | | 428/613 |
| 2012/0126487 | A1 | 5/2012 | Kennedy et al. |
| 2019/0264345 | A1 | 8/2019 | Sugawara et al. |

FOREIGN PATENT DOCUMENTS

| | | | |
|---|---|---|---|
| GB | 1476099 | A | 6/1977 |
| GB | 1482747 | | 8/1977 |
| GB | 2158842 | A | 11/1985 |
| JP | 1975066442 | | 6/1975 |
| JP | S5066442 | A | 6/1975 |
| JP | 2010185116 | A | 8/2010 |
| KR | 100503497 | * | 7/2005 ............... C21D 1/74 |
| WO | 2014111616 | | 7/2014 |
| WO | 2014111624 | | 7/2014 |
| WO | 2015107255 | | 7/2015 |
| WO | 2015107256 | | 7/2015 |

OTHER PUBLICATIONS

International Standard ISO 4516, Second edition Jun. 15, 2002, 18 Pages, "Metallic and other inorganic coatings—Vickers and Knoop microhardness tests".
International Search Report for PCT/FI2016/050625, Completed by the Finnish Patent and Registration Office on Nov. 17, 2016, 5 Pages.
El-Sharif et al. Materials Science Forum, Trans Tech Publications, Switzerland 1994, vols. 163-165, pp. 633-638, "Effect of heat treatment on microstructure of Cr—Ni—Fe coatings prepared by electrodeposition".
Huang et al. Surface & Coatings Technology 2014, vol. 255, pp. 153-157, "Microstructure analysis of a Cr—Ni multilayer pulse-electroplated in a bath containing trivalent chromium and divalent nickel ions".
Huang et al. Surface & Coatings Technology 2009, vol. 203, pp. 3686-3691, "Hardness variation and corrosion behavior of asplated and annealed Cr—Ni alloy deposits electroplated in a trivalent chromium-based bath".
International Search Report for PCT/FI2015/050587, Completed by the Finnish Patent and Registration Office on Dec. 11, 2015, 4 Pages.
He et al. Advanced Materials Research, Trans Tech Publications, Switzerland 2011, vols. 150-151, pp. 1555-1559, "Effect of Ni2+ on Chromium electrodeposition in Cr(III) Plating Bath".
Zhong et al. Advanced Materials Research, Trans Tech Publications, Switzerland 2013, vols. 785-786, pp. 948-952, "The electrodeposition of Ni—Fe—Cr alloy coatings on mild steel surfaces and evaluation of corrosion resistance".

* cited by examiner

CHROMIUM-BASED COATING, A METHOD FOR PRODUCING A CHROMIUM-BASED COATING AND A COATED OBJECT

CROSS-REFERENCE TO RELATED APPLICATION

This application is the U.S. national phase of PCT Application No. PCT/FI2016/050625 filed on Sep. 8, 2016, which claims priority to PCT Application No. PCT/FI2015/050587 filed on Sep. 9, 2015, the disclosures of which are incorporated in their entirety by reference herein.

FIELD OF THE INVENTION

The invention relates to a chromium-based coating and a method for producing a chromium-based coating. The invention also relates to an object coated with a chromium-based coating.

BACKGROUND OF THE INVENTION

Chromium coating is widely used as a surface coating for different articles because of its high hardness value, attractive appearance and superior wear and corrosion resistance. Traditionally, Cr deposition is accomplished by electroplating from an electrolytic bath containing hexavalent Cr ions. The process is highly toxic in nature. Lots of efforts have been made to develop alternative coatings and coating processes to replace hexavalent Cr in electroplating. Among those alternative processes, trivalent Cr electroplating seems to be attractive due to its low cost, convenience of fabrication through the use of environmental friendly and non-toxic chemicals, and ability to produce a bright Cr deposit. However, an industrial scale process giving a hard and corrosion resistant Cr deposit through an aqueous trivalent chromium solution is still difficult to achieve.

Many chromium plating processes of prior art are not capable of producing coatings with a Vickers microhardness value of 1500 HV or more as measured according to standard SFS-EN ISO 4516. Further defects of the known chromium-based coatings are their inadequate wear and corrosion resistances. Chromium coating as such is very brittle in character. The number of cracks and micro-cracks in a chromium coating increases together with the thickness of the coating, thus impairing the corrosion resistance of the coating.

Deposition of nickel, either by electroless plating or electroplating, has also been proposed as an alternative to hard chrome. Drawbacks of nickel plating include deficiencies in hardness, friction coefficient and wear resistance. Nickel plating and chrome are not interchangeable coatings. The two have unique deposit properties and, therefore, each has its distinct applications.

Partial solutions to the problem have been proposed in the patent documents, WO 2015/107256 A1, WO 2015/107255 A1, WO 2014/111624 A1 and WO 2014/111616 A1, in which chromium-containing coatings are described.

Further, in the document Huang et al 2009 (Hardness variation and corrosion behavior of as-plated and annealed Cr—Ni alloy deposits electroplated in a trivalent chromium-based bath, Surface & Coatings Technology 203: 3686), a method for producing a Cr—Ni alloy-based coating is disclosed. The coating suffers from poor corrosion resistance if heat-treated at a temperature over 350° C. Therefore, a sequential two-step electrodeposition method is recommended.

In Huang et al. 2014 (Microstructure analysis of a Cr—Ni multilayer pulse-electroplated in a bath containing trivalent chromium and divalent nickel ions, Surface & Coatings Technology 255: 153), on the other hand, a Cr—Ni multilayer comprised of alternating nanosized amorphous Cr-rich and crystalline Ni-rich sublayers was successfully prepared by pulse-current electroplating in a plating bath containing $Cr^{3+}$ and $Ni^{2+}$ ions. In Huang et al. 2009 and Huang et al. 2014, the nickel concentration in the electroplating bath was 0.2 M and 0.4 M, respectively.

PURPOSE OF THE INVENTION

The purpose of the invention is to provide a new type of a chromium-based coating and a method for producing a chromium-based coating.

SUMMARY

The chromium-based coating according to the present disclosure is characterized by what is presented in claim 1.

The method for producing a chromium-based coating according to the present disclosure is characterized by what is presented in claim 11.

A coated object according to the present disclosure is characterized by what is presented in claim 24.

BRIEF DESCRIPTION OF THE DRAWINGS

The accompanying drawings, which are included to provide a further understanding of the disclosure and constitute a part of this specification, illustrate embodiments of the invention and together with the description help to explain the principles of the invention. In the drawings.

DETAILED DESCRIPTION OF THE INVENTION

Figure 1:
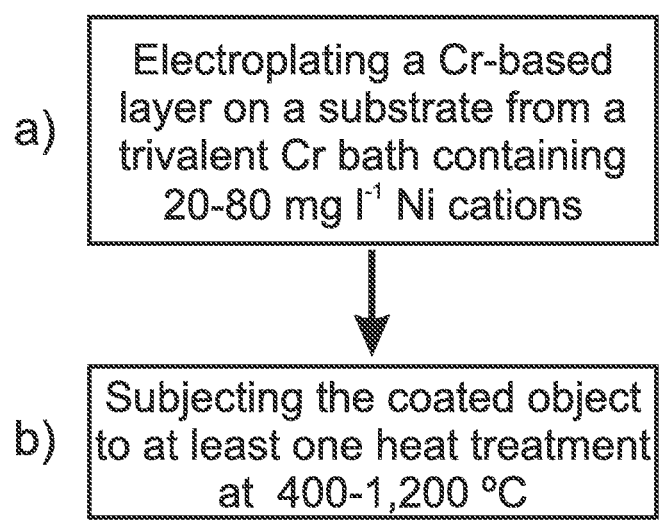
FIG. 1 is a flow chart illustration of an embodiment of the method according to the current disclosure.

In one aspect, a chromium-based coating comprising chromium (Cr), carbon (C) and iron (Fe), Cr being electroplated from a trivalent Cr bath is disclosed. The coating is characterized in that the coating further comprises nickel (Ni) electroplated from the Cr bath containing at least 20 mg $l^{-1}$ Ni cations, in that C is at least partially in the form of at least one chromium carbide compound, in that the coating has been heat-treated at a temperature of 400-1,200° C., or at temperature of 400-650° C., or at a temperature of 650-820° C., or at a temperature of 820-1,200° C., and in that the hardness of the coating is at least 1,500 HV on a Vickers microhardness scale as measured according to standard SFS-EN ISO 4516. The standard is based on a micro-indentation test of inorganic coatings, including metal coatings. The temperature of the heat treatment may be, for example 650-1,200° C. Alternatively, the temperature of the heat treatment may be 700-800° C. The temperature of the heat treatment may be 650-820° C. It is also possible to perform the heat treatment in a temperature of 830-900° C. Thus, within the temperature range of 400-1,200° C., various alternatives exist. Temperature of 400-650° C. may be used in some situations. Alternatively, a temperature of 650-800° C. may be used. Also a temperature of 800-1,200° C. may be used.

By a heat treatment is herein meant, unless otherwise stated, a treatment in which the temperature of the coating reaches the given temperature at least momentarily. The coating according to the present disclosure typically comprises 90-95 w-% Cr. The Fe content of the coating is typically 5-8 w-%. The Ni content is typically 0.5-3 w-%. The coating composition can be analyzed by energy dispersive X-ray spectroscopy (EDS). The coating further comprises C, but the amount is not measurable with an EDS measurement. Carbon is present as at least one carbide. Due to the method of manufacture, the coating typically contains further elements in addition to Cr, Ni, Fe and C. For example copper (Cu) and zinc (Zn) may be present. They may exist as pure elements or in various compounds or mixtures with Cr, Ni Fe and C or each other.

In this disclosure, unless otherwise stated, electroplating, electrolytic plating and electrodeposition are to be understood as synonyms. By depositing a layer on the object is herein meant depositing a layer directly on the object to be coated or on the previous layer that has been deposited on the object. In the present disclosure, Cr is deposited through electroplating from a trivalent Cr bath. In this connection, the wording "electroplating from a trivalent chromium bath" is used to define a process step in which a chromium-based layer is deposited from an electrolytic bath in which chromium is present substantially only in the trivalent form.

The Ni source for the current coating is the Cr bath. The bath contains at least 20 mg $l^{-1}$ Ni cations. The cations can be $Ni^{2+}$ cations or $Ni^{4+}$ cations. It is possible that both $Ni^{2+}$ cations and $Ni^{4+}$ cations are the source of the Ni in the coating. In one embodiment, the Cr bath contains 20 to 150 mg $l^{-1}$ Ni cations. In one embodiment, the Cr bath contains 20 to 80 mg $l^{-1}$ Ni cations. Further, it is possible that the bath contains at least 50 mg $l^{-1}$ Ni cations. For example, the bath may contain 50 to 100 mg $l^{-1}$ Ni cations.

The thickness of the Cr-containing layer(s) can vary widely depending on the application. For decorative coating applications, a thinner layer is necessary than for corrosion or wear-resistant coating applications. The thickness of the coating depends on the number and thickness of the layers it comprises. The thickness of the coating can vary between 0.05-200 μm. The thickness of the coating may be, for example 0.5-100 μm. Alternatively, the thickness of the coating may be 0.3-5 μm.

The thickness and the composition of both the coating and its optional constituent layers together determine the properties of the coating. Typically coatings according to the present disclosure are hard. They can be used to replace traditional hard chromium coatings.

In one embodiment, the hardness of the coating is at least 1,500 $HV_{0.05}$. Embodiments can be envisaged in which the hardness of the coating is at least 2,000 HV.

In one embodiment, the at least one chromium carbide compound comprises $Cr_3C_2$, $Cr_7C_3$ or $Cr_{23}C_6$, or a combination thereof. The term chromium carbide is herein to be understood to include all the chemical compositions of chromium carbide, such as $Cr_3C_2$, $Cr_7C_3$ and $Cr_{23}C_6$. The amount and ration between different chromium carbide compounds can vary. Chromium carbides advantageously improve the hardness of the coating.

In one embodiment, at least some of the Ni and Cr are dissolved in each other. Ni and Cr are dissolvable in each other in different concentrations. In other words, the metals can be completely dissolved in each other. The metals can alternatively be only partially dissolved in each other. The mutual dissolving may take place during a heat treatment of the coating according to the present disclosure. When the two metals are at least partially dissolved in each other, Ni is not necessarily detectable in an XRD spectrum measurement.

It is possible that the coating comprises one or more chromium oxide. Without limiting the current disclosure to any specific theory, the chromium oxide(s) may be formed during heat treatment. Examples of chromium oxides that can be present in the coating are $CrO_3$, CrO, $Cr_2O_3$ or their combinations.

It is further possible that the coating comprises chromium nitride (CrN). Without limiting the current disclosure to any specific theory, the chromium nitride may be formed during heat treatment.

Both chromium oxide(s) and chromium nitride may influence the properties of the coating according to the present disclosure.

The abrasion wear of a coating can be measured for example by the Taber abrasion test. The result is expressed as a Taber index, where a smaller value indicates higher abrasion resistance. Typical values of hard chromium coatings range from 2 to 5 when the test is done according to the standard ISO 9352. The test was performed with TABER 5135 Abraser, the type of the wheel was CS 10, rotation speed 72 rpm, load 1,000 g and the total number of cycles 6,000. The wear was determined by measuring the initial weight of the object, intermediate weights after every 1,000 cycles and the end weight of the object after finishing the test. The coating according to the present disclosure has excellent abrasion resistance indicated by a Taber index of 2 and below under the same test conditions. In one embodiment, the Taber index of the coating measured by the Taber abrasion test according to ISO 9352 is below 2, or below 1.

In one embodiment, the coating forms at least two layers with distinctive element compositions. In other words, the coating according to the present disclosure can be used as a combination with other layers of coating. The other layers of coating may comprise different materials, which can be selected from metals and their alloys or from other substances used for coatings. By a layer is herein meant a segment of a coating that is substantially parallel to the surface of a coating and is distinguishable in an electron micrograph (such as transmission electron micrograph, TEM, or scanning electron micrograph, SEM), light micrograph or by energy-dispersive X-ray spectroscopy (EDS). The visibility of the layers can be improved by using methods such as etching or ion etching during cross-sectioning of the coating to be analyzed. The boundaries between layers do not need to be well defined. On the contrary, during a heat treatment, the boundaries of the layers mix to some extent. Without limiting the invention according to the present disclosure to any specific theory, there might be some amount of migration or diffusion of layer components during the heat treatment. The extent to which the components might be migrating or diffusing depends, for example, on the duration and intensity of the heat treatment and the layer components.

In one embodiment, there is a mixed layer between the substrate and the chromium-based coating, said mixed layer comprising both substrate material and coating components and being produced by heat-treatment of the coated substrate.

By a mixed layer is herein meant a layer that shares some properties with the neighboring layers, but remains distinguishable from them. A mixed layer can be located between the substrate and the chromium-based coating. In cases where the coating comprises more than one layer, the mixed layer can additionally or alternatively be located between two layers of coating. If the coating according to the present disclosure comprises an intermediate layer, the mixed layer can additionally or alternatively be located between an intermediate layer and a coating layer.

If the coating forms at least two layers with distinctive element compositions, a mixed layer may be present between any two layers with distinctive element compositions.

The mixed layer can be a multiphase layer. For example, a mixed layer that is a multiphase layer may comprise Ni—Cr and the Cr-based coating according to the present disclosure. A multiphase layer may comprise Fe—Cr and the Cr-based coating according to the present disclosure. A multiphase layer may comprise X—Cr and the Cr-based coating according to the present disclosure. X denotes any element or compound with which the Cr-based coating according to the present disclosure may be mixed with.

By a phase is herein meant a region in which the physical properties of the substance are constant. One layer can comprise a single phase or it can comprise more than one phase, each of which can be formed of one or more element, substance or compound. A layer can comprise more than one element, substance or compound, in which case each of them can independently comprise one or more phases. In every case in which there are two or more phases in a layer—representing one or more element, substance or compound—the layer is called a multiphase layer.

When the coating according to the present disclosure comprises more than one layer, there can be an intermediate layer between the two layers of coating. For example, the intermediate layer may contain copper or an alloy of copper. For example, the intermediate layer may contain molybdenum or an alloy of molybdenum. The intermediate layer may contain inorganic nonmetallic solid selected from the group comprising metal oxides, metal carbides, metal borides, metal nitrides, metal silicides, and mixtures thereof.

Further, the adhesion between two neighboring layers can be enhanced. For example, a strike layer can be positioned between the layers. A strike layer is one possible alternative of an intermediate layer. The strike layer may comprise sulphamate nickel, bright nickel, such as Watts nickel or Woods nickel, titanium, or any other suitable material. The surface structure of the layer that is first coated on the substrate can be amended through etching, for example. The surface of the first layer can be treated with strong acid, preferably with 30% (w/w) hydrochloric acid, before depositing the strike layer.

In one embodiment, the coating is coated directly on a substrate. By a substrate is herein meant any surface on which the coating according to the present disclosure is coated on. Generally, the coating according to the present disclosure can be used on variable substrates. Therefore, in many applications, there is no need to provide an underlayer or a strike layer on the substrate before coating. The substrate can be made of a metal or of metal alloy. For example, the substrate may be steel, copper or nickel. The substrate can be made of ceramic material. The substrate does not need to be homogenous material. In other words, the substrate may be heterogeneous material. The substrate can be layered. For example, the substrate can be a steel object coated by a layer of nickel phosphorus alloy (Ni—P). The thickness of the Ni—P layer may be, for example, 1-5 μm. The substrate coated with a Ni—P layer may be pre-treated in a furnace (at a temperature of 300-500° C.) to enhance the diffusion of Ni—P and its mixing with the substrate material. Such a substrate may be subsequently heat treated at a higher temperature of, for example, 500, 600 or 850° C. In one embodiment, the chromium-based coating is coated on a layer of Ni—P.

It is possible for the substrate to comprise a Ni strike layer under the coating according to the present disclosure.

In one embodiment, the coating further comprises a top layer. Thin film deposition, such as physical vapor deposition (PVD), chemical vapor deposition (CVD) or atomic layer deposition (ALD) can be used for producing the top layer. By a top layer is herein meant a layer positioned on the outer surface of the coated object. Providing a top layer on the coated object may be used for adjusting the colour of the coated object or for altering the friction and/or wear-resistance properties of the coated object. The top layer may comprise metal, metal alloy, ceramic, or diamond like carbon.

In one aspect, a method for producing a chromium-based coating according to the current disclosure on an object by electroplating from a trivalent Cr bath is disclosed. The method is characterized in that it comprises the steps of a) depositing a layer of Cr from a trivalent Cr bath on an object, the bath comprising at least one source for trivalent Cr, at least 20 mg $l^{-1}$ Ni cations, at least one source for C and at least one source for Fe, so that Ni, C and Fe are incorporated into the Cr layer; and b) subjecting the coated object to at least one heat treatment at a temperature of 400-1,200° C., or at temperature of 400-650° C., or at a temperature of 650-820° C., or at a temperature of 820-1,200° C., to amend the mechanical and physical properties of the coating. The temperature of the heat treatment may be, for example 650-1,200° C. Alternatively, the temperature of the heat treatment may be 700-800° C. The temperature of the heat treatment may be 650-800° C. It is also possible to perform the heat treatment in a temperature of 830-900° C. Thus, within the temperature range of 400-1,200° C., various alternatives exist. Temperature of 400-650° C. may be used in some situations. Alternatively, a temperature of 650-800° C. may be used. Also a temperature of 800-1,200° C. may be used.

At step a) of the method, a Cr layer is deposited on a coatable object. During the Cr deposition, Ni and Fe are codeposited from the bath. C is also included in the deposited layer. The Cr electroplating step can be carried out using any commercially available Cr(III) bath. One example of an electrolyte solution that has been used in the trivalent chromium coating step is the one sold by Atotech Deutschland GmbH under trade name Trichrome Plus®. In one embodiment, the at least one source for Ni is $NiCl_2$ or metallic Ni. The concentration of Ni cations in the Cr bath may be, for example 20 to 150 mg l $l^{-1}$. The concentration of Ni cations in the Cr bath may be, for example 20 to 80 mg $l^{-1}$. Further, it is possible that the concentration of Ni cations in the Cr bath may be at least 50 mg $l^{-1}$. For example, the bath may contain 50 to 100 mg $l^{-1}$ Ni cations.

The determination of Ni concentration in the bath is performed with methods known in the art. For example, atomic absorption spectroscopy (AAS) may be used. The methods require extensive dilution of the bath solution for carrying out the analysis. Typically, a dilution factor of 25 is used. Therefore, the measurement values are prone to have inaccuracies in the range of some mg $l^{-1}$.

The current density during the electroplating can influence the exact coating composition, as the relative coating efficiencies of different ions vary according to the current density. In one embodiment, the current density during the coating is 10-50 A $dm^{-2}$, or 15 A $dm^{-2}$. It is thus possible to use a current density of 15 A dm$^{-2}$. Also current densities, such as 20 or 40 A dm$^{-2}$ are suitable.

At step b) of the method, the coated object is subjected to a heat treatment to amend the mechanical and physical properties of the coating.

Additionally, depending on the material of the coated object (i.e. substrate material), also the object properties can be amended. For example, if the coated object is steel and the heat treatment is carried out at a suitable temperature, the steel can be hardened at step b). Such a heat treatment can be performed at a temperature of, for example, 700° C. or 800° C.

Hardening is a metallurgical process used to increase the hardness of a metal. As an example, steel can be hardened by cooling from above the critical temperature range at a rate that prevents the formation of ferrite and pearlite and results in the formation of martensite (quenching). Hardening may involve cooling in water, oil or air, according to the composition and size of the article and the hardenability of the steel. In case the hardening of a metal object is carried out in connection with a heat treatment of the coated object, it is possible to subsequently subject the object to annealing or tempering in a second heat treatment, which is carried out after quenching. It is also possible to subject an already hardened metal object to a further hardening during the heat treatment of the coated object even though the metal object had originally been hardened before the coating.

The method can comprise further heat treatments especially targeted for amending the mechanical and physical properties of the coated object.

At step b), for example crystalline forms of the coating constituents may be formed. Depending on the length and temperature of the heat treatment, it is also possible that diffusion takes place between the coating and substrate. This may lead to the formation of mixed layers. However, it is possible that the diffusion is so limited that no mixed layer is formed. After the heat treatment(s), the boundary between two layers or between the coating and the substrate is typically not clear-cut, but some amount of diffusion may have taken place.

The method according to the present disclosure may comprise more than one heat treatment. The method can comprise, for example, two heat treatments. The method can comprise, for example, three heat treatments. The method can comprise more than three heat treatments. The heat treatments do not need to be identical. The length of a heat treatment may be 5-60 min, for example 15-60 minutes. The coated object can be cooled after at least one heat treatment. Water or air can be used for cooling.

Heat treatment can be carried out, for instance, in a conventional gas furnace in ambient gas atmosphere or in in a protective gas atmosphere. In one embodiment, step b) is performed in an ambient atmosphere. The length of such a heat treatment may be, for example 30 minutes.

Heat treatment can be carried out by induction, flame heating, laser heating or salt bath heat treatment. For induction heating, flame heating, laser heating and salt bath heat treatment, the duration of the heat treatment is typically shorter than for furnace heating. The length of a heat treatment may thus be some seconds, for example 0.5-30 seconds, such as 10 seconds.

In one embodiment, the at least one heat treatment in step b) is induction heating or furnace heating. Induction heating is a no-contact process that quickly produces intense, localized and controllable heat. With induction, it is possible to heat only selected parts of the coated metal substrate. Flame heating refers to processes where heat is transferred to the object by means of a gas flame without the object melting or material being removed. Laser heating produces local changes at the surface of the material while leaving the properties of the bulk of a given component unaffected. Heat treating with laser involves solid-state transformation, so that the surface of the metal is not melted. Both mechanical and chemical properties of a coated article can often be greatly enhanced through the metallurgical reactions produced during heating and cooling cycles.

In one embodiment, the object to be coated is of metal and the hardening of the metal of the object is carried out at the same time as the coated object is heat treated. For simultaneous heat treatment and hardening of the object, especially induction heating is suitable, since it is uniform and the hardening of the metal object can be achieved only in the vicinity of the surface, in the range of few millimeters below the surface.

In one embodiment, the at least one heat treatment in step b) is induction heating and the object is cooled by cooling liquid for 0.1-60 seconds, or for 0.5-10 seconds, or for 0.8-1.5 seconds, after the end of the heating. The object can thus be cooled for 0.1-60 seconds. The object can be cooled for 0.5-10 seconds. The object can be cooled for 0.8-1.5 seconds. One way of performing the induction heating and the subsequent cooling is to pass the object to be treated through a stationary induction coil that is situated at a predetermined distance from a stationary jet of cooling liquid. After the object exits the induction coil, it will move to the jet of cooling liquid. Alternatively the object to be treated can be stationary and the induction coil and cooling stream moving. Thus, the lag time between the end of the heating and the beginning of the liquid cooling can be controlled by the relative speeds of the object to be treated and the heating and cooling means. For example, the heat treatment of step c) may be induction heating, the distance between the heating coil and the cooling jet is 25 mm and the speed of the induction coil and the cooling liquid jet relative to the object to be heated is 500-3,000 mm min$^{-1}$, preferably 1,500 mm min$^{-1}$. The cooling liquid can be, for example, water or suitable emulsion.

The method according to the present disclosure may comprise a step of depositing an intermediate layer. The intermediate layer may comprise a metal or metal alloy or ceramic. The method according to the present disclosure may comprise a step of electroplating an intermediate nickel layer between the two layers of the chromium-based coating according to the present disclosure. If the coating comprises more than one layer with distinctive element composition, the intermediate layer can be located between any of these layers.

In one embodiment of the method, a layer of Ni—P is coated on the object before step a).

In one embodiment, the method comprises an additional step c) of depositing a top layer after step b) by thin film deposition, such as physical vapor deposition (PVD), chemical vapor deposition (CVD), atomic layer deposition (ALD) or electroplating or electroless plating. The methods for producing a top layer are well established and selecting a suitable one and adjusting its parameters is within the knowledge of the skilled person. The top layer can be made of any suitable material that is able to give the coated surface the desired properties. Suitable materials comprise, for instance, metals, metal alloys, ceramics, nitrides (TiN, CrN), and diamond like carbon (DLC). Ni—P can be deposited as the top layer. Nickel-phosphate compounds lend themselves for coloring or other modifications. As an example, acid post dip processes can be used for producing a darker-colored surface, which can be black in extreme cases. Processes for producing black NiP coatings are known in the art.

In most applications, the coated object is first heat treated and then a top layer is deposited.

In one embodiment, the method comprises an additional step c) of depositing a top layer before step b) by thin film deposition, such as physical vapor deposition (PVD), chemical vapor deposition (CVD), atomic layer deposition (ALD) or electroplating or electroless plating. In other words, it is possible to produce a thin film deposited top layer on the coated object before a heat treatment. It is also possible that step c) comprises a heat treatment on its own. In this case, the heat treatment is optimized for completion of the top layer and therefore its parameters can be different from those of the heat treatment in step b) of the current method. Selecting heat treatment parameters for finalizing the top layer is within the knowledge of the skilled person.

In one embodiment, the steps a) and b) are repeated at least once before step c). In other words, the electroplating step a) and the heat treatment b) can be repeated once or more before depositing a top layer. In one embodiment, the steps a), b) and c) are repeated at least once.

In one embodiment, the object to be coated is of metal and the method comprises an additional step i) of carburizing the object before step a). The carbon content of a steel substrate is increased through carburizing.

The method according to the present disclosure can comprise further process steps. These can be for example pretreatment steps. An example of such is chemical and/or electrolytic degreasing to remove oil and dirt from the surface to be coated. Another example is pickling to activate the surface before the actual coating and plating steps. Also additional protective layers can be used. As an example a coating comprising copper or zinc can be used as a temporary protective layer. Such a coating can be removed by, for example dissolving with a suitable solution (e.g. acid) or grinding, to expose the coating according to the present disclosure. These pre- and post-treatment steps belong to the knowledge of the skilled person and can be selected according to the intended application.

In one aspect, a coated object is disclosed. The coated object is characterized in that it comprises a coating according to the present disclosure or a coating produced by a method according to the present disclosure. For example, the coated object may be a gas turbine, shock absorber, hydraulic cylinder, linked pin, a ball valve or an engine valve. The object that is coated can be of any material, such as ceramic, metallic or metal alloy material that is used for functions requiring high hardness and corrosion resistance. There are many applications in which a coated object according to the present disclosure can be used.

The embodiments of the invention described hereinbefore may be used in any combination with each other. Several of the embodiments may be combined together to form a further embodiment of the invention. A method, a coating or an object, to which the invention is related, may comprise at least one of the embodiments of the invention described hereinbefore.

The method and the coating according to the present disclosure offer at least one of the following advantages over prior art:

An advantage of the coating according to the present disclosure is that it can be coated on many different kinds of substrates. The coating can be electroplated directly over a substrate.

An advantage of the coating according to the present disclosure is that it has high hardness and good wearing resistance. The corrosion resistance of the coating may be improved over prior-art solutions. The resistance of the coating to sulfuric acid can be improved over prior-art solutions.

A further advantage of the coating according to the present disclosure is that the Ni-containing Cr-based coating can be hardened at a temperature which is high enough for hardening of the substrate.

EXAMPLES

The description below discloses some embodiments of the invention in such a detail that a person skilled in the art is able to utilize the invention based on the disclosure. Not all steps of the embodiments are discussed in detail, as many of the steps will be obvious for the person skilled in the art based on this specification.

FIG. 1

FIG. 1 is a flow-chart presentation of an embodiment of the current method. In step a) of the method, a Cr-based layer is deposited on a substrate. The Cr is deposited from a bath of trivalent Cr containing at least 20 mg $l^{-1}$ Ni cations. The presence of Ni and Fe in the bath leads to their co-deposition into the Cr-based layer. C is also included in the coating. At step b) of the method, the coated object is subjected to at least one heat treatment at a temperature of 400-1,200° C. As a result of the heat treatment, the mechanical and physical properties of the coating are amended, leading to the formation of a hard coating with a Vickers microhardness of at least 1,500 HV as measured according to standard SFS-EN ISO 4516. Depending on the specifics of the heat treatment, it is possible that also the mechanical and physical properties of the substrate are affected to a predetermined depth. If the substrate is steel, the substrate is typically hardened.

FIG. 2

Figure 2:
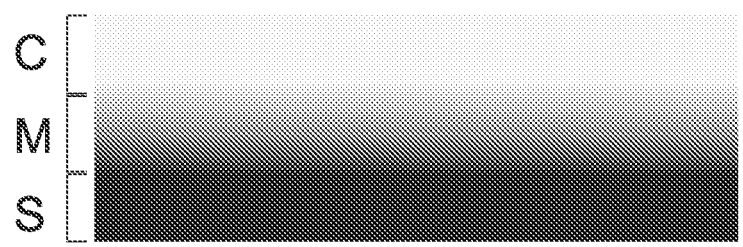
FIG. 2 is a schematic presentation of an embodiment of a coating according to the present disclosure.

FIG. 2 is a schematic presentation of a structure of a coating according to the present disclosure. The coating layer C is depicted with light gray. The surface of the coating layer C in the figure is at the top of FIG. 2. The substrate S is depicted with black color at the bottom of the figure. Between the coating layer C and the substrate, a mixed layer M is visible. The coating layer C means the coating according to the present disclosure. The mixed layer M is depicted to be approximately of equal thickness as the coating layer C. In most applications, the mixed layer M is, however, thinner than the coating layer C. For example, the coating layer C may be 7 μm thick and the mixed layer M may be 1 μm thick.

Example 1

A trivalent chromium-containing bath was prepared as is known in the art. For example, an electrolyte solution comprising 20-23 g $l^{-1}$ trivalent chromium ions and 60-65 g $l^{-1}$ boric acid (as sold by Atotech Deutschland GmbH under the trade name Trichrome Plus®) can be used. $NiCl_2$ was added to the electrolyte solution to achieve $Ni^{2+}$ concentration of 50 mg $l^{-1}$ (approximately 0.85 mM). The bath was subjected to a normal initial plating, after which it was ready for use.

A chromium coating was coated on a substrate at a current density of 15 A $dm^{-2}$ for 30 min, at a pH of 2.6 (step a) of the method) with anode/cathode surface ratio of 2:1. Two anodes were used, each having its own power supply. This was to ascertain the uniform distribution of the current density over the object to be coated.

The substrate was then rinsed and heat-treated at 700° C. for 30 min (step b) of the method). The coating thickness was approximately 15-20 μm and hardness 1,500-1,700 $HV_{0.05}$. The coating comprised approximately 1% (w/w) Ni measured through an EDS measurement. Attention was paid to the evenness of air and liquid movement, as well as to their efficiency to ascertain evenness of coating.

In a variation of the method of Example 1, the substrate was heat-treated at a temperature of 400° C. for 30 min at step b). In another variation of Example 1, the heat treatment of step b) was performed for 30 min at a temperature of 840° C.

Example 2

A steel object is carburized prior to electroplating a coating according to the present disclosure. The object is carburized to the same depth as the hardening of the object will be performed at step b) of the method. The carbon content is at least approximately 0.5% (w/w) in the carburized part of the object.

After carburization, the object is coated and the coating is heat-treated at a temperature of 500-700° C. for 30 minutes. The metal object is then hardened by induction hardening. The carburization may be advantageous as it allows the hardening of the steel at temperatures below 800° C.

Example 3

A trivalent chromium-containing bath was prepared as in Example 1, so that a $Ni^{2+}$ concentration of 50 mg $l^{-1}$ (approximately 0.85 mM) was achieved and the bath was subjected to a normal initial plating.

A chromium coating was coated on a substrate at a current density of 15 A $dm^{-2}$ for 40 min, at a pH of 2.6 (step a) of the method) with anode/cathode surface ratio of 2:1. Two anodes were used, each having its own power supply.

The substrate was then rinsed and heat-treated at 700° C. for 30 min. The coating thickness was approximately 15-20 μm and hardness 1,500-1,700 $HV_{0.05}$. The coating comprised approximately 1% (w/w) Ni measured through an EDS measurement. The coated substrate was then heat treated in a furnace or by induction heating at a temperature of 820-860° C., after which the coated substrate was quenched in water or in oil.

It is obvious to a person skilled in the art that with the advancement of technology, the basic idea of the invention may be implemented in various ways. The invention and its embodiments are thus not limited to the examples described above; instead they may vary within the scope of the claims.

The invention claimed is:

1. A method for producing a chromium-based coating on an object by electroplating from a trivalent Cr bath, wherein the chromium-based coating comprises chromium (Cr), carbon (C), nickel (Ni) and iron (Fe), wherein C is at least partially in the form of at least one chromium carbide compound, and wherein the method comprises the steps of
   a) depositing by electroplating a layer of Cr from the trivalent Cr bath on an object, the bath comprising at least one source for trivalent Cr, at least 20 mg $l^{-1}$ Ni cations, at least one source for C and at least one source for Fe, so that Ni, C and Fe are incorporated into the layer of Cr which comprises 90-95 w-% Cr and 0.5-3 w-% Ni forming a coated object; and
   b) subjecting the coated object to at least one heat treatment at a temperature of 400-1,200° C., to amend the mechanical and physical properties of the coating;
   wherein the hardness of the coating is at least 1,500 HV on a Vickers microhardness scale as measured according to standard SFS-EN ISO 4516.

2. The method according to claim 1, wherein the at least one source for Ni is $NiCl_2$ or metallic Ni.

3. The method according to claim 1, wherein step b) is performed in an ambient atmosphere.

4. The method according to claim 1, wherein the current density during the coating is 10-50 A $dm^{-2}$.

5. The method according to claim 1, wherein the at least one heat treatment in step b) is induction heating or furnace heating.

6. The method according to claim 1, wherein the at least one heat treatment in step b) is induction heating and the object is cooled by cooling liquid for 0.1-60 seconds, after the end of the heating.

7. The method according to claim 1, wherein the method comprises an additional step c) of depositing a top layer after step b) by thin film deposition.

8. The method according to claim 1, wherein the method comprises an additional step c) of depositing a top layer before step b) by thin film deposition.

9. The method according to claim 7, wherein the steps a) and b) are repeated at least once before step c).

10. The method according to claim 7, wherein the steps a), b) and c) are repeated at least once.

11. The method according to claim 1, wherein the object to be coated is of metal and the method comprises an additional step i) of carburizing the object before step a).

12. The method according to claim 1, wherein a layer of Ni—P is coated on the object before step a).

13. The method according to claim 1, wherein the object to be coated is of metal and hardening of the metal of the object is carried out at the same time as the coated object is heat treated.

14. The method according to claim 1, wherein thin film deposition is performed using physical vapor deposition (PVD), chemical vapor deposition (CVD), atomic layer deposition (ALD), electroplating or electro-less plating.

15. The method according to claim 8, wherein thin film deposition is performed using physical vapor deposition (PVD), chemical vapor deposition (CVD), atomic layer deposition (ALD), electroplating or electro-less plating.

16. A method for producing a chromium-based coating on a metal object by electroplating from a trivalent Cr bath, wherein the chromium-based coating comprises chromium (Cr), carbon (C), nickel (Ni) and iron (Fe), wherein C is at least partially in the form of at least one chromium carbide compound, and wherein the method comprises the steps of
   a) depositing by electroplating a layer of Cr from the trivalent Cr bath directly on a metal object, the bath comprising at least one source for trivalent Cr, at least 20 mg $l^{-1}$ Ni cations, at least one source for C and at least one source for Fe, so that Ni, C and Fe are incorporated into the layer of Cr which comprises 90-95 w-% Cr and 0.5-3 w-% Ni forming a coated object;
   b) subjecting the coated object to at least one induction heat treatment at a temperature of 400-1,200° C.; and
   c) cooling the object with a cooling liquid for 0.1-60 seconds, after the end of the heating to amend the mechanical and physical properties of the coating and the metal object
   wherein the hardness of the coating is at least 1,500 HV on a Vickers microhardness scale as measured according to standard SFS-EN ISO 4516.

* * * * *